(12) United States Patent
Guo et al.

(10) Patent No.: US 7,772,595 B2
(45) Date of Patent: Aug. 10, 2010

(54) NITRIDE SEMICONDUCTOR SUBSTRATE, METHOD FOR FORMING A NITRIDE SEMICONDUCTOR LAYER AND METHOD FOR SEPARATING THE NITRIDE SEMICONDUCTOR LAYER FROM THE SUBSTRATE

(75) Inventors: Yih-Der Guo, Hsinchu (TW); Chih-Ming Lai, Pingtung County (TW); Jenq-Dar Tsay, Kaohsiung (TW); Po-Chun Liu, Taichung County (TW)

(73) Assignee: Industrial Technology Research Institute, Hsinchu (TW)

( * ) Notice: Subject to any disclaimer, the term of this patent is extended or adjusted under 35 U.S.C. 154(b) by 136 days.

(21) Appl. No.: 11/554,603

(22) Filed: Oct. 31, 2006

(65) Prior Publication Data
US 2008/0054292 A1 Mar. 6, 2008

(30) Foreign Application Priority Data
Aug. 31, 2006 (TW) ............... 95132153 A

(51) Int. Cl.
*H01L 27/15* (2006.01)
(52) U.S. Cl. ............ 257/79; 257/13; 257/103; 257/95; 257/98; 257/E33.074; 257/E21.001; 257/E21.002; 257/E21.04; 257/E21.085; 257/E21.328; 257/E21.331; 257/E21.347; 257/E21.349; 257/E21.334; 257/E21.34
(58) Field of Classification Search ........... 257/E33.034
See application file for complete search history.

(56) References Cited

U.S. PATENT DOCUMENTS

| 5,919,305 | A | 7/1999 | Solomon |
| 6,261,929 | B1* | 7/2001 | Gehrke et al. ............... 438/478 |
| 6,559,075 | B1 | 5/2003 | Kelly et al. |
| 6,686,257 | B1 | 2/2004 | Wu et al. |
| 6,740,604 | B2 | 5/2004 | Kelly et al. |
| 7,271,424 | B2* | 9/2007 | Chen ........................... 257/98 |
| 2006/0284187 | A1* | 12/2006 | Wierer et al. ................. 257/79 |

* cited by examiner

*Primary Examiner*—Minh-Loan T Tran
*Assistant Examiner*—Fei Fei Yeung Lopez
(74) *Attorney, Agent, or Firm*—Jianq Chyun IP Office

(57) ABSTRACT

There is provided a method of forming a nitride semiconductor layer, including the steps of firstly providing a substrate on which a patterned epitaxy layer with a pier structure is formed. A protective layer is then formed on the patterned epitaxy layer, exposing a top surface of the pier structure. Next, a nitride semiconductor layer is formed over the patterned epitaxy layer connected to the nitride semiconductor layer through the pier structure, wherein the nitride semiconductor layer, the pier structure, and the patterned epitaxy layer together form a space exposing a bottom surface of the nitride semiconductor layer. Thereafter, a weakening process is performed to remove a portion of the bottom surface of the nitride semiconductor layer and to weaken a connection point between the top surface of the pier structure and the nitride semiconductor layer. Finally, the substrate is separated from the nitride semiconductor layer through the connection point.

4 Claims, 3 Drawing Sheets

NITRIDE SEMICONDUCTOR SUBSTRATE, METHOD FOR FORMING A NITRIDE SEMICONDUCTOR LAYER AND METHOD FOR SEPARATING THE NITRIDE SEMICONDUCTOR LAYER FROM THE SUBSTRATE

CROSS-REFERENCE TO RELATED APPLICATION

This application claims the priority benefit of Taiwan application serial no. 95132153, filed Aug. 31, 2006. All disclosure of the Taiwan application is incorporated herein by reference.

BACKGROUND OF THE INVENTION

1. Field of the Invention

The present invention relates to a method of forming a group III/V semiconductor layer, and in particular to a method of forming a nitride semiconductor layer and separating the same from a substrate.

2. Description of Related Art

In the recent years, light emitting diodes (LED) and laser diodes (LD) are now prevailing in commercial use. For example, a mixture of blue and yellow phosphors made of gallium nitride (GaN) is capable of generating white light, which leads to a high luminance and substantially low power consumption over a conventional light bulb. In addition, the LED has a lifetime of more than tens of thousand hours, longer than that of the conventional light bulb.

In the process of manufacturing a GaN semiconductor LED, due to mismatched lattice constants and differential coefficients of thermal expansion between a GaN semiconductor layer and a hetero-substrate, the GaN semiconductor easily encounters the problems caused by threading dislocation and thermal stress during an epitaxy process, which drastically deteriorates luminance efficiency of the LED.

According to the prior art, a method of separating the GaN semiconductor layer from the hetero-substrate includes applying an irradiating method whereby laser beams pass through a substrate and illuminate an interlayer between the substrate and the GaN semiconductor layer. Thus, the GaN semiconductor layer and the hetero-substrate are separated. Moreover, a wet etching method can also be performed to directly remove a barrier structure between the substrate and the GaN semiconductor layer so as to weaken a connection structure therebetween and to further separate the GaN semiconductor layer from the hetero-substrate. In addition, a vapor phase etching process can be performed at a high temperature to directly remove the interlayer between the GaN semiconductor layer and the hetero-substrate. Thus, the GaN semiconductor layer and the hetero-substrate are separated.

Nevertheless, said methods are not capable of mitigating the loss in luminance efficiency of the GaN semiconductor layer due to the defects of threading dislocation and thermal stress in the epitaxy process.

SUMMARY OF THE INVENTION

The present invention provides a method of forming a nitride semiconductor layer. Thereby, a gallium nitride (GaN) semiconductor layer with a roughened surface is formed to enhance the irradiating effect of the GaN semiconductor layer.

The present invention further provide a method of separating the GaN semiconductor layer from a substrate by weakening a structure therebetween.

Still another object of the present invention is to provide a nitride semiconductor substrate. A patterned epitaxy layer of the substrate comprises a pier structure whereby a timing of separating the nitride semiconductor layer from the substrate can be measured.

The present invention provides a nitride semiconductor substrate whose patterned epitaxy layer comprises the pier structure. The structural strength thereof can be enhanced by adjusting an aspect ratio and a distribution density of the pier structure, so that a light emitting device (LED) layer can be further formed on the nitride semiconductor layer over the patterned epitaxy layer.

The present invention provides a method of forming a nitride semiconductor layer, comprising the steps of providing a substrate at first. Next, a patterned epitaxy layer is formed on the substrate, wherein the patterned epitaxy layer comprises a pier structure. A protective layer is then formed on the patterned epitaxy layer and exposes a top surface of the pier structure. After that, a nitride semiconductor layer is formed over the patterned epitaxy layer connected to the nitride semiconductor layer through the pier structure, wherein the nitride semiconductor layer, the pier structure, and the patterned epitaxy layer together form a space exposing a bottom surface of the nitride semiconductor layer. Thereafter, a weakening process is performed to remove a portion of the bottom surface of the nitride semiconductor layer and to weaken a connection point between the top surface of the pier structure and the nitride semiconductor layer. Finally, the substrate is separated from the nitride semiconductor layer through the connection point.

According to the method of forming the nitride semiconductor layer illustrated in a preferred embodiment of the present invention, the weakening process comprises a step of using an electrolytic solution.

According to the method of forming the nitride semiconductor layer illustrated in a preferred embodiment of the present invention, the electrolytic solution comprises a potassium hydroxide (KOH) solution.

According to the method of forming the nitride semiconductor layer illustrated in a preferred embodiment of the present invention, the weakening process further comprises a step of applying an irradiating method to facilitate the weakening process.

According to the method of forming the nitride semiconductor layer illustrated in a preferred embodiment of the present invention, the concentration of the electrolytic solution is approximately 0.5~15M.

The method of forming the nitride semiconductor layer illustrated in a preferred embodiment of the present invention comprises a hydride vapor-phase epitaxy method and a metal organic chemical vapor-phase epitaxy method.

According to the method of forming the nitride semiconductor layer illustrated in a preferred embodiment of the present invention, the material of the substrate is selected from a group consisting of silicon, silicon carbide, sapphire, arsenide, phosphide, zinc oxide (ZnO), and magnesium oxide.

The present invention further provides a separating method. Said method comprises the steps of providing a substrate having a nitride semiconductor layer disposed thereon and connected thereto through a pier structure. The nitride semiconductor layer, the pier structure, and the patterned epitaxy layer together form a space exposing a bottom surface of the nitride semiconductor layer. Next, an electrolytic solution is used within the space to remove a portion of the bottom surface of the nitride semiconductor layer and to weaken a connection point between the pier structure and the nitride semiconductor layer. Finally, the substrate is separated from the nitride semiconductor layer.

According to the method of forming the nitride semiconductor layer illustrated in a preferred embodiment of the present invention, the electrolytic solution comprises a potassium hydroxide (KOH) solution.

According to the method of forming the nitride semiconductor layer illustrated in a preferred embodiment of the present invention, an irradiating method is used to expeditiously remove a portion of the nitride semiconductor layer.

According to the method of forming the nitride semiconductor layer illustrated in a preferred embodiment of the present invention, the concentration of the electrolytic solution is approximately 0.5~15M.

The method of forming the nitride semiconductor layer illustrated in a preferred embodiment of the present invention comprises a hydride vapor-phase epitaxy method and a metal organic chemical vapor-phase epitaxy method.

According to the method of forming the nitride semiconductor layer illustrated in a preferred embodiment of the present invention, the material of the substrate is selected from a group consisting of silicon, silicon carbide, sapphire, arsenide, phosphide, zinc oxide (ZnO), and magnesium oxide.

The present invention further provides a nitride semiconductor substrate. The nitride semiconductor substrate comprises a substrate, a patterned epitaxy layer, and a protective layer. The patterned epitaxy layer is disposed on the substrate, wherein the patterned epitaxy layer comprises a pier structure. The protective layer is disposed over the substrate and covers a portion of the patterned epitaxy layer to expose a top surface of the pier structure.

The material of the nitride semiconductor substrate illustrated in a preferred embodiment of the present invention is selected from a group consisting of silicon, silicon carbide, sapphire, arsenide, phosphide, zinc oxide (ZnO), and magnesium oxide.

According to the nitride semiconductor substrate illustrated in a preferred embodiment of the present invention, the material of the protective layer comprises dielectric material.

The present invention further provides a nitride semiconductor substrate. The nitride semiconductor substrate comprises a substrate, a patterned epitaxy layer, a protective layer, and a gallium nitride (GaN) semiconductor layer. The patterned epitaxy layer is disposed on the substrate, wherein the patterned epitaxy layer comprises a pier structure. The protective layer is disposed over the substrate and covers a portion of the patterned epitaxy layer to expose a top surface of the pier structure. The GaN semiconductor layer is disposed over the substrate and connected thereto through the exposed top surface of the pier structure, wherein the GaN semiconductor layer, the pier structure, and the substrate together form a space exposing a bottom surface of the GaN semiconductor layer.

The material of the nitride semiconductor substrate illustrated in a preferred embodiment of the present invention is selected from a group consisting of silicon, silicon carbide, sapphire, arsenide, phosphide, zinc oxide (ZnO), and magnesium oxide.

According to the nitride semiconductor substrate illustrated in a preferred embodiment of the present invention, the material of the protective layer comprises dielectric material.

In the present invention, a patterned epitaxy layer is disposed between the nitride semiconductor layer and the substrate. The epitaxy layer comprises a pier structure. The pier structure and the nitride semiconductor layer together form a space exposing the bottom surface of the GaN semiconductor layer. Accordingly, the weakening process is performed within the space exposing a portion of the bottom surface to weaken the connection point between the GaN semiconductor layer and the pier structure. Thereby, the weakened connection point which is no longer capable of withstanding the stress breaks and consequently separates the GaN semiconductor from the substrate. Furthermore, during the weakening process, a portion of the bottom surface of the GaN semiconductor layer is roughened to form several pyramidal protrusions. Thereby, the irradiating effect can be enhanced when the GaN semiconductor layer having a roughened surface is successively used as an LED.

In order to the make aforementioned and other objects, features and advantages of the present invention comprehensible, a preferred embodiment accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
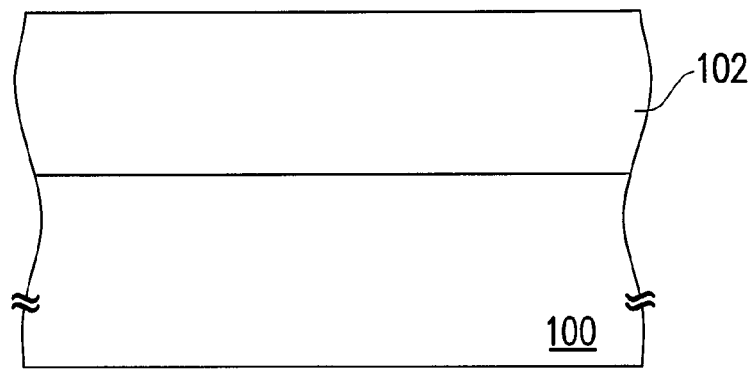
FIGS. 1A through 1F depict a method of forming a nitride semiconductor layer according to one preferred embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A through 1F illustrate a method of forming a nitride semiconductor layer according to a preferred embodiment of the present invention. Firstly, referring to FIG. 1A, a substrate 100 is provided. The material of the substrate 100 is selected from a group consisting of silicon, silicon carbide, sapphire, arsenide, phosphide, zinc oxide (ZnO), and magnesium oxide. Then, an epitaxy layer 102 is formed on the substrate 100. The material of the epitaxy layer 102 comprises an indium-containing nitride semiconductor, an aluminum-containing nitride semiconductor, or a gallium-containing nitride semiconductor.

Figure 1B:
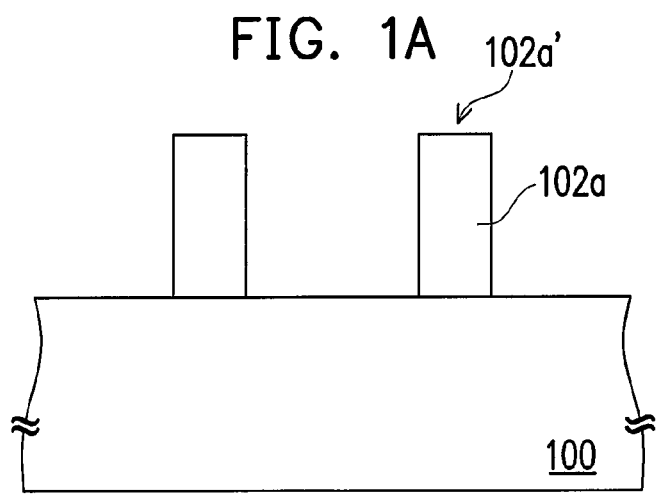
Figure 2:
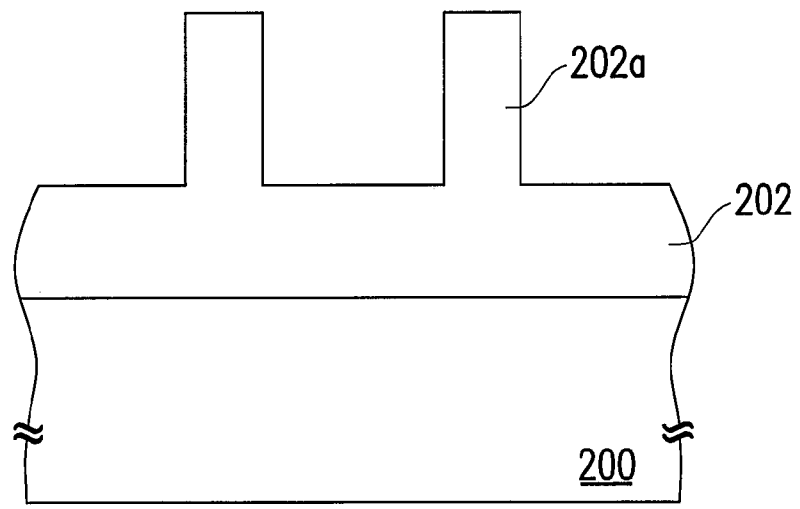
FIG. 2 depicts a simplified sectional view of a patterned epitaxy layer according to another preferred embodiment of the present invention.

Referring to FIG. 1B, a patterning process is performed to pattern the epitaxy layer 102, so that a patterned epitaxy layer 102a having a pier structure 102a' is formed. In the present embodiment, the patterned epitaxy layer 102a exposes a portion of a top surface of the substrate 100. However, the present invention is not limited to this embodiment. FIG. 2 depicts a simplified sectional view of a patterned epitaxy layer according to another preferred embodiment of the present invention. Referring to FIG. 2, in another embodiment, the patterned epitaxy layer 202 having a pier structure 202a does not expose a top surface of a substrate 200. Namely, the epitaxy layer is partially patterned so as to form the patterned epitaxy layer 202. Moreover, the pier structure 102a'/202a has a point-like or a bar-like cross-sectional profile.

Figure 1C:
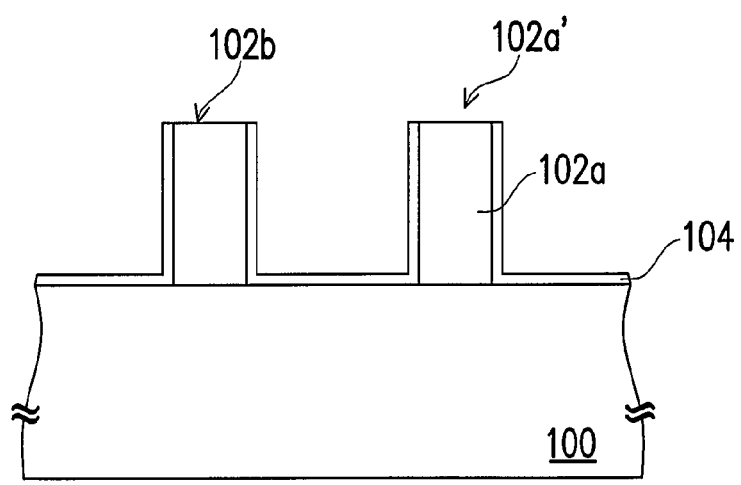

Referring to FIG. 1C, a protective layer 104 is formed over the substrate 100. The protective layer 104 covers a portion of the patterned epitaxy layer 102 and exposes a top surface 102b of the pier structure 102a'. Wherein, the protective layer 104 is made of dielectric material, for example.

Figure 1D:
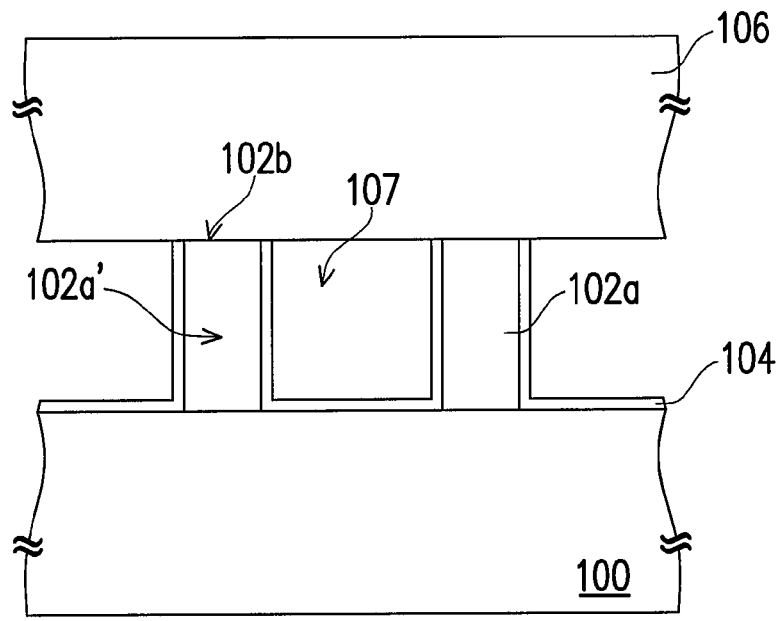

Referring to FIG. 1D, an epitaxy process is performed to form a nitride semiconductor layer, e.g. a gallium nitride (GaN) semiconductor layer 106 over the substrate 100. The method of forming the GaN semiconductor layer 106 is, for example, a hydride vapor-phase epitaxy method and a metal organic chemical vapor-phase epitaxy method. It should be noted that the nitride semiconductor layer 106 is connected to the patterned epitaxy layer 102a through the pier structure 102a'. That is to say, during the epitaxy process, the exposed top surface 102b of the pier structure 102a' provides an epitaxial environment, i.e. a nucleus surface, resulting in an upward and lateral growth of the GaN semiconductor layer 106 on the top surface 102b. And the nitride semiconductor layer 106, the pier structure 102a', and the patterned epitaxy layer 102a together form a space 107 exposing a bottom surface of the nitride semiconductor layer 106.

Figure 1E:
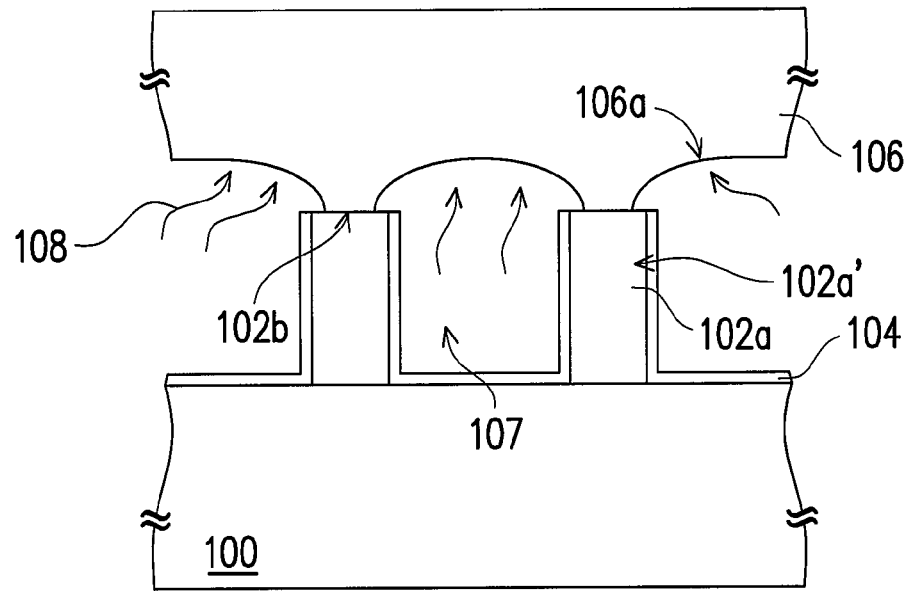

Referring to FIG. 1E, a weakening process 108 is then performed within the space 107 exposing the bottom surface of the GaN semiconductor layer 106 to remove a portion of the bottom surface of the nitride semiconductor layer 106 and weaken a connection point between the top surface 102b of the pier structure 102a' and the nitride semiconductor layer. Wherein, the weakening process 108 includes a step of using an electrolytic solution. The electrolytic solution preferably comprises a potassium hydroxide (KOH) solution, and the concentration of the electrolytic solution is approximately 0.5~15M. Moreover, the weakening process 108 further comprises a step of using an irradiating method to facilitate the weakening process 108, so that the electrolytic solution can expeditiously react with the bottom surface of the GaN semiconductor layer 106.

Note that when the weakening process 108 is performed to remove the partially exposed bottom surface of the GaN semiconductor layer 106, the bottom surface is simultaneously roughened and several hexagonal pyramidal protrusions are then formed thereon. Thereby, the irradiating effect can be enhanced when the GaN semiconductor layer 106 is successively used as an LED.

Figure 1F:
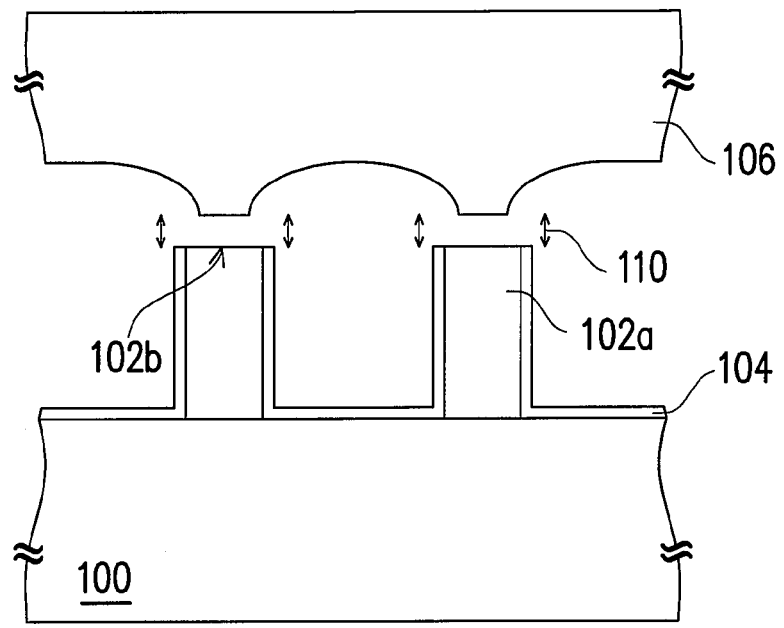

During the weakening process 108, the connection point between the GaN semiconductor layer 106 and the pier structure 102a' can withstand less and less stress arisen from hetero materials. Hence, when the weakened connection point between the GaN semiconductor layer 106 and the pier structure 102a' can no longer withstand any stress, the GaN semiconductor layer 106 is then separated from the substrate 100 due to the disconnection 110 between the GaN semiconductor layer 106 and the connection point of the pier structure 102a', as is shown in FIG. 1F.

Furthermore, the method of separating the nitride semiconductor layer, i.e. said GaN semiconductor layer, from the substrate can be further applied through a cooling step during the epitaxy process. Namely, through the cooling step, the differential coefficients of thermal expansion between the nitride semiconductor layer and the substrate result in the disconnection between the GaN semiconductor layer and the connection point of the pier structure 102a'.

In addition, when the patterned epitaxy layer 102a having the pier structure 102a' is formed, an aspect ratio and a distribution density of the pier structure 102a' can be adjusted, so that the structural strength of the pier structure surpasses the stress between the nitride semiconductor layer and the substrate. Thereby, after the nitride semiconductor layer is formed, a light emitting device (LED) layer can be formed on the nitride semiconductor layer prior to separating the nitride semiconductor layer from the substrate. And the method of forming the LED layer on the nitride semiconductor layer is, for example, a hydride vapor-phase epitaxy method and a metal organic chemical vapor-phase epitaxy method. Besides, through adjustment of the aspect ratio and the distribution density of the pier structure 102a' and enhancement of the structural strength of the pier structure 102a', not only can the LED layer be formed on the nitride semiconductor layer before the nitride semiconductor layer is separated from the substrate, but also a P-type or an N-type electrode photolithographic process can be performed on the LED layer.

In view of the foregoing, the present invention discloses a patterned epitaxy layer disposed between the nitride semiconductor layer and the substrate. The epitaxy layer comprises a pier structure. The pier structure and the nitride semiconductor layer together form a space exposing the bottom surface of the GaN semiconductor layer. Accordingly, the weakening process is performed within the space exposing a portion of the bottom surface to weaken the connection point between the GaN semiconductor layer and the pier structure. Thereby, the weakened connection point which is no longer capable of withstanding the stress breaks and consequently separates the GaN semiconductor from the substrate. Furthermore, during the weakening process, a portion of the bottom surface of the GaN semiconductor layer is roughened to form several pyramidal protrusions. Thereby, the irradiating effect can be enhanced when the GaN semiconductor layer having a roughened surface is successively used as an LED.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A nitride semiconductor substrate, comprising:
   a substrate;
   a gallium nitride (GaN) semiconductor layer extending substantially across an entire area above the substrate;
   a multi-spaced structure disposed between the substrate and the GaN semiconductor layer, wherein the multi-spaced structure has a plurality of piers directly in contact with a portion of a bottom surface of the GaN semiconductor layer and a space between the piers exposes the rest portion of the bottom surface of the GaN semiconductor layer and exposes a surface of the multi-spaced structure;
   a protective layer covering the surface of the multi-spaced structure.

2. The nitride semiconductor substrate of claim 1, wherein the material of the substrate comprises silicon, silicon carbide, sapphire, arsenide, phosphide, zinc oxide (ZnO), and magnesium oxide.

3. The nitride semiconductor substrate of claim 1, wherein the material of the protective layer comprises dielectric material.

4. The nitride semiconductor substrate of claim 1, wherein a shape of a cross-sectional profile of each of the piers comprises a point shape and a bar shape.

* * * * *